(12) United States Patent
Kosinski

(10) Patent No.: US 7,750,752 B1
(45) Date of Patent: Jul. 6, 2010

(54) PROGRAMMABLE SAW FILTER MODULE

(75) Inventor: John A. Kosinski, Neptune, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 115 days.

(21) Appl. No.: 11/818,455

(22) Filed: Jun. 13, 2007

(51) Int. Cl.
  *H04B 3/16* (2006.01)
  *H03H 9/64* (2006.01)
  *H03H 7/38* (2006.01)

(52) U.S. Cl. .................. 333/17.1; 333/17.3; 333/193; 333/150; 333/152

(58) Field of Classification Search ................ 333/17.1, 333/17.3, 150, 152, 154, 193; 310/313 B
See application file for complete search history.

(56) References Cited

U.S. PATENT DOCUMENTS

| | | | | |
|---|---|---|---|---|
| 3,723,919 A | * | 3/1973 | Adler | 333/194 |
| 4,024,480 A | * | 5/1977 | Reeder et al. | 333/166 |
| 4,254,388 A | * | 3/1981 | Mikoshiba et al. | 333/195 |
| 4,480,237 A | * | 10/1984 | Yamada | 333/193 |
| 4,575,696 A | * | 3/1986 | Hartmann et al. | 333/154 |
| 4,602,228 A | * | 7/1986 | Yamada | 333/194 |
| 4,752,750 A | | 6/1988 | Zimmerman et al. | |
| 4,775,846 A | * | 10/1988 | Shiba et al. | 333/194 |
| 5,051,709 A | | 9/1991 | Birkett et al. | |
| 5,194,837 A | | 3/1993 | Smythe, Jr. et al. | |
| 5,225,798 A | * | 7/1993 | Hunsinger et al. | 333/165 |
| 5,387,887 A | | 2/1995 | Zimmerman et al. | |
| 5,973,578 A | * | 10/1999 | Zharov et al. | 333/166 |
| 6,459,345 B1 | | 10/2002 | Kosinski et al. | |
| 7,132,908 B1 | | 11/2006 | Kosinski et al. | |

OTHER PUBLICATIONS

Pastore, Jr., R. et al, "Design of a Selectable Performance Front End Filter Using Acoustic Surface Wave Résonators", Proceedings of the 1997 IEEE International Frequency Control Symposium, May 1997, pp. 858-866.

* cited by examiner

*Primary Examiner*—Barbara Summons
(74) *Attorney, Agent, or Firm*—Michael Zelenka; Stephen J. Harbulak

(57) ABSTRACT

Programmable SAW filter module are provided to overcome undesirable drawbacks, limitations and shortcomings associated with "in-line" SAW filters, such as insertion loss, propagation loss and strong signal capture effects. The programmable SAW filter modules remove the SAW structure from the primary signal path, adding signal gain to drive the splitter and using the SAW portion of the circuit as a programmable impedance element. The programmable SAW filter module includes an amplifier, an impedance, a surface acoustic wave propagation element, a splitter, input and output IDT electrodes, input and output interdigitated transducers, means for gain control and a combiner to combine or sum the signals received from the output IDT electrodes and form an output signal. The input and output IDT's are fully integrated circuits comprising the power splitter and power combiner functions, the phase shift, and gain functions. The embodiments include an amplifier and impedance preceding the input splitter, the amplifier preceding the input splitter with the impedance connected to the combiner, and placing programmable SAW devices in both branches of the circuit.

10 Claims, 3 Drawing Sheets

PROGRAMMABLE SAW FILTER MODULE

GOVERNMENT INTEREST

The invention described herein may be manufactured, used, and licensed by or for the United States Government for governmental purposes without payment to me of any royalties thereon.

FIELD OF THE INVENTION

The present invention relates generally to the field of electronic filters, and more particularly to an improved programmable SAW filter module.

BACKGROUND OF THE INVENTION

The Surface Acoustic Wave (SAW) is used as the basis for a variety of electronic devices including delay lines, filters, and correlators which are key components in numerous electronic applications. Radio frequency (RF) SAW filters have a number of desirable characteristics with respect to their size and cost along with their electronic properties such as insertion loss, bandwidth, transfer function, etc. Numerous advances in this field have led to greatly improved SAW device reliability and performance, and RF SAW filters have found widespread application in modern mobile communications equipment such as cellular telephones. However, each new development in mobile communications has required a new filter design matched to the new frequencies and spectral characteristics of the transmitted waveforms. As an alternative to regular re-design and development of new hardware, it is desirable to have a tunable RF SAW filter capable of providing a variety of specified electrical characteristics, such as low insertion loss, tunable bandwidth, tunable frequency, and tunable filter transfer function.

Prior developments in the field of programmable transversal filters based on SAW devices and closely related fields that provide useful guidance on these choices are reviewed in "Design of a Selectable Performance Front End Filter Using Acoustic Surface Wave Resonators," by R. Pastore, J. A. Kosinski, W. N. Porter, and H. L. Cui, in Proceedings of the 1997 IEEE International Frequency Control Symposium, May 1997, pp. 858-866. Transversal filters utilizing a SAW device and programmable transversal filters have found many different applications. Examples of transversal filters include Zimmerman et al. U.S. Pat. No. 4,752,750 "Hybrid Programmable Transversal Filter," issued on Jun. 21, 1988, Birkett et al. U.S. Pat. No. 5,051,709 "SAW Device Tapped Delay Line and Equalizer," issued on Sep. 24, 1991, Smythe, Jr. et al. U.S. Pat. No. 5,194,837 "Multi-Tap Programming Circuit for Transversal Filters," issued on Mar. 16, 1993 and Zimmerman et al. U.S. Pat. No. 5,387,887 "Miniature Digitally Controlled Programmable Transverse Filter Using LSI GAAS Integrated Circuits," issued on Feb. 7, 1995. These patents disclose programmable transversal filters that obtain some of the desired electronic characteristics but still suffer from a number of deficiencies such as triple transient echo, conversion loss and an insertion loss penalty associated with both imperfect energy conversion and propagation loss.

The improved filters disclosed in Kosinski et al. U.S. Pat. No. 6,459,345 "Programmable SAW Filter Including Unidirectional Transducers," which disclosed incorporating a finger array, phase shifters and gain devices to eliminate bidirectional energy loss, and Kosinski et al. U.S. Pat. No. 7,132,908 "Selectable Performance Interference Filter" which disclosed the use of asynchronous IDT finger arrays, have reduced and minimized the deleterious effects of triple transit echo and the insertion loss penalty to a great degree while enabling a greater flexibility than previously possible. However, the complete elimination of the negative effects of the insertion loss penalty is not possible with any of the prior art arrangements. The energy conversion losses at the SAW input and output IDT arrays and the SAW propagation loss all contribute to undesirable device insertion loss. While the use of unidirectional transducers as in Kosinski et al. U.S. Pat. No. 6,459,345 helps to minimize the conversion loss, the propagation loss is inherent in the device and cannot be eliminated. The propagation loss can be compensated to some level through additional gain in the tap weighting circuitry, however, the gain cannot be increased arbitrarily while maintaining a desired weighting function, and hence the overall filter will still suffer from a certain amount of loss and an attendant noise figure.

In addition to some residual insertion loss, the improved filters disclosed in Kosinski et al. U.S. Pat. No. 6,459,345 and No. 7,132,908 also encumber the unforeseen difficulty of strong signal capture. While the incorporation of a tunable input IDT provides clear advantage in enabling greater flexibility with respect to the filter transfer function, the tunable input IDT necessarily places gain elements ahead of the filter transfer function where they are susceptible to being saturated by strong signals outside of the intended filter bandwidth. Such is not a significant drawback in intermediate filter (IF) applications where out-of-band signal levels are somewhat limited. However, in pre-selector applications where one expects large interference signals, the prior art programmable SAW filters of U.S. Pat. No. 6,459,345 and No. 7,132,908 are susceptible to deleterious signal capture effects that pre-selector filters are otherwise meant to overcome and obviate.

The common flaw with prior art programmable SAW filters, especially with respect to pre-selector applications, is that they are inherently "in-line" devices requiring the RF signal to pass through all of the RF filter component parts, with the exception of the control circuitry. The "in-line" configuration inherently places broadband gain elements ahead of any SAW-based filter transfer function, and thus is inherently and unavoidably subject to strong signal capture effects. Thus, there has been a long-felt need for programmable SAW filters and filter components which are not "in-line" devices and do not suffer from the undesirable drawbacks, limitations and shortcomings associated with insertion loss, propagation loss, and strong signal capture effects.

SUMMARY OF THE INVENTION

The present invention fulfills the long-felt need for programmable SAW filters that do not suffer from the drawbacks, limitations and shortcomings associated with "in-line" SAW filters, including insertion loss, propagation loss, and strong signal capture effects with a programmable SAW Filter Module comprising an amplifier, an impedance, a surface acoustic wave propagation element, interdigitated transducer finger arrays, a splitter, a combiner, and a means for gain control.

It is an object of this invention to provide an improved programmable SAW filter module.

It is a further object of this invention to provide an improved programmable SAW filter module that does not suffer from the undesirable drawbacks, limitations and shortcomings associated with insertion loss and propagation loss.

It is still a further object of this invention to provide an improved programmable SAW filter module that overcomes the prior art's undesirable drawbacks, limitations and shortcomings associated with "in-line" SAW filters, including insertion loss, propagation loss, and strong signal capture effects.

These and other objects are advantageously accomplished with the present invention providing a programmable SAW filter module comprising an amplifier, an impedance, a surface acoustic wave propagation element, a splitter, input and output IDT electrodes preferably configured with phase shifters and operated as unidirectional transducers, means for gain control, and a combiner to combine or sum the signals received from the output IDT electrodes to form an output signal. The input and output IDT's are fully integrated circuits comprising the power splitter and power combiner functions, the phase shift, and gain functions. The present invention provides a number of features to overcome the prior art's undesirable drawbacks, limitations and shortcomings associated with "in-line" SAW filters, including insertion loss, propagation loss, and strong signal capture effects by removing the SAW structure from the primary signal path, adding signal gain to drive the splitter and using the SAW portion of the circuit as a programmable impedance element.

The present invention encompasses embodiments with an amplifier and impedance preceding the input splitter, the amplifier preceding the input splitter with the impedance connected to the combiner, and placing programmable SAW devices in both branches of the circuit. The rationale behind the present invention, its principles of operation and its basic design criteria are presented fully in the following description of the invention.

DETAILED DESCRIPTION OF THE DRAWINGS

Figure 1:
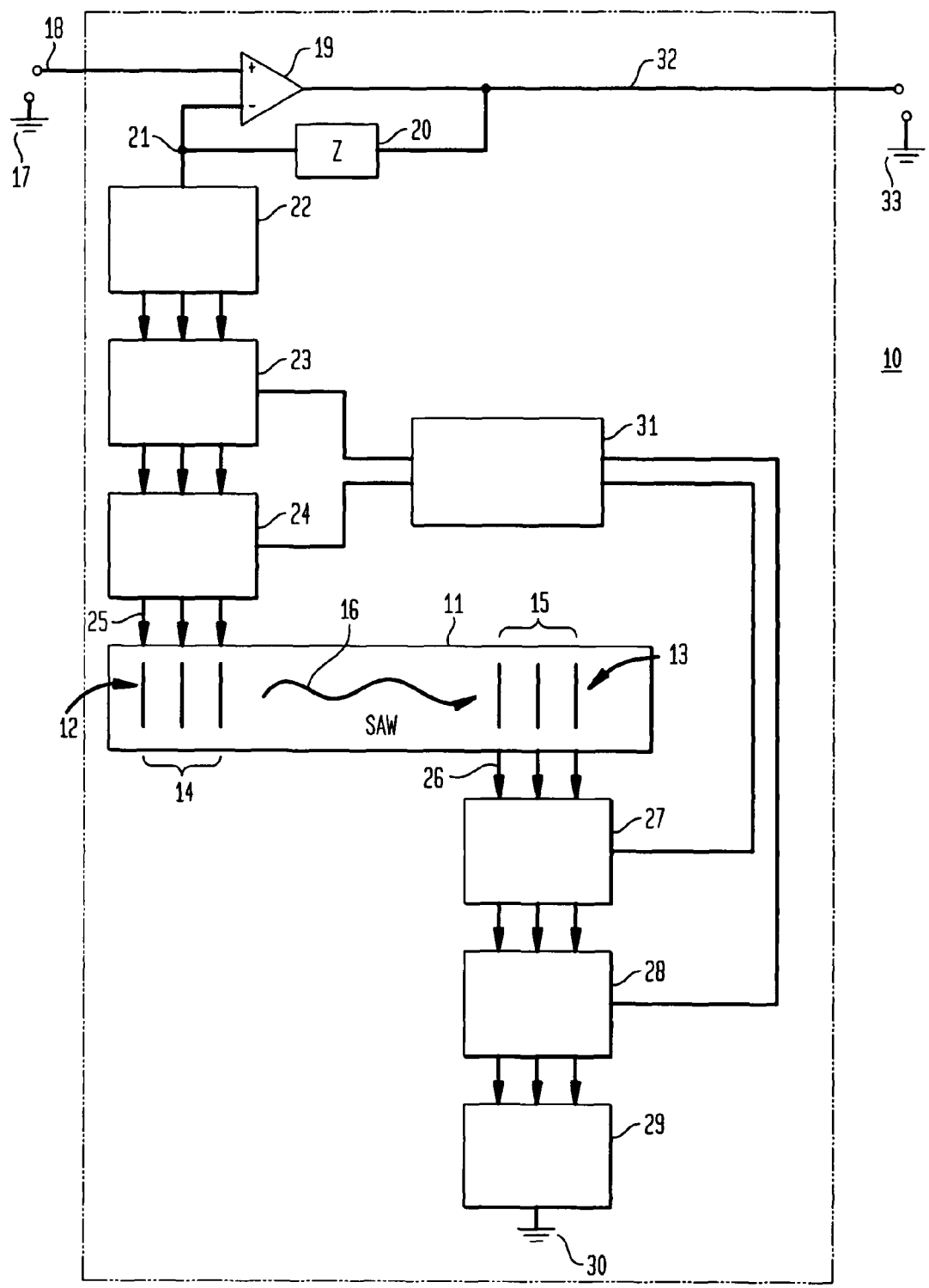
FIG. 1 is a diagram of the programmable SAW filter module with an amplifier and impedance before the input splitter in accordance with the present invention.

Referring now to the drawings, FIG. 1 is a conceptual diagram of the first embodiment of the programmable SAW filter module 10. The input to the module is made at terminals 17 and 18. An input signal applied to terminal 18 is received by the non-inverting input of operational amplifier 19. The output of operational amplifier 19 is provided in parallel to the output terminals 32 and 33 of the module and feedback impedance 20. The majority of the output signal from operational amplifier 19 is delivered to the output terminals 32 and 33 while a small portion of the signal is passed through feedback impedance 20. The signal passing through feedback impedance 20 is then applied in parallel to the inverting input of operational amplifier 19 and to a series of components providing for a programmable SAW transversal filter functioning as a programmable SAW impedance element. The programmable SAW impedance element includes an input splitter 22 that splits the input signal 21 for an input phase shifter 23 that independently varies the phase of a number of the split input signals 25 and provides a set of phase-shifted input signals to an input gain control 24. The input gain control 24 provides a variable gain to each split input signal 25 applied to each of the input IDT electrode fingers 14 formed on the surface of a piezoelectric substrate 11.

The piezoelectric substrate 11 hosts the input IDT electrode fingers 14 and provide an input unidirectional transducer 12 and a group of output IDT electrode fingers 15 similarly provide an output unidirectional transducer 13. The input IDT electrode fingers 14 each have a uniform spacing and width. SAW 16 is generated by the input unidirectional transducer 12 and detected by the output unidirectional transducer 13. Because the input phase shifter 23 properly selects the signal phase for the split input signals 25, the input transducer electrode fingers 14 function as a unidirectional interdigitated transducer (IDT).

The output IDT electrode fingers 15 have a uniform spacing and width which differs from that of the input IDT electrode fingers 14 such that mechanical triple transit echo is avoided. The output of the output unidirectional transducer 13 is provided to a variable output gain control 27, which is variable with a different output gain or weighting coefficient being applied to each output IDT finger 15 in the output unidirectional transducer 13. An output phase shifter 28 is coupled to the variable output gain control 27 and provides a variable phase shift for some of the IDT output signals 26. Proper selection of the signal phase applied to the IDT output signals 26 results in the output interdigitated transducer electrode fingers 15 functioning as a unidirectional interdigitated transducer. The output phase shifter 28 provides a variable phase shift for a selected group of IDT output signals and provides a phase-shifted group of IDT output signals to a combiner 29. The combiner 29 combines or sums the individual electrode finger output signals 26 to form a single composite output signal 29. A phase control circuit and gain control circuit, both represented by Box 31, are coupled to the input phase shifter 23, the input gain control 24, the output gain control 27 and the output phase shifter 28 to selectively monitor, control or program the variable phase and the variable gain of the individual input and output signals. The composite output signal from combiner 29 is then delivered to ground 30.

In operation, the filter transfer function from input terminals 17 and 18 to output terminals 32 and 33 is given by the expression:

$$T(f) = 1 + \frac{Z(f)}{Z_{SAW}(f)} \quad (1)$$

where $Z(f)$ is the impedance 20, which is usually frequency dependent, and $Z_{SAW}(f)$ is the effective impedance generated by the balance of the programmable SAW filter module circuit. A number of design criteria and filter characteristics are immediately evident. First, the limitation of this filter is the baseline unity gain:

$$T(f)=1 \text{ when } Z_{SAW}(f)>>Z(f) \quad (2)$$

However, where $$Z_{SAW}(f)<<Z(f) \quad (3)$$

then $$T(f) \approx \frac{Z(f)}{Z_{SAW}(f)} \quad (4)$$

and the achievable degree of filter selectivity is essentially defined by the equation:

$$\frac{Z(f)}{Z_{SAW}(f)} \quad (5)$$

As an example, consider $Z(f)$ to be a 1 MΩ resistor and $Z_{SAW}(f)$ to vary between 1Ω in the passband center and 1 MΩ well out of band. In that case, the available selectivity is about 60 dB. In this case, the programmable portion of this invention's programmable SAW filter module 10 is operated in a bandpass mode with low in-band impedance and high out-of-band impedance. It should be noted that the transfer function $T(f)$ between module input terminals 17 and 18 and module output terminals 32 and 33 is not obtained directly as the transfer function $H(f)$ of the programmable SAW transversal filter segment obtained in the prior art structures disclosed in Kosinski U.S. Pat. No. 6,459,345 and No. 7,132,908 comprising splitter 22, phase adjustments 23 and 28, gain elements 24 and 27, SAW 16, and combiner 29. In this invention, the transfer function $T(f)$ depends upon controlling the effective impedance $Z_{SAW}(f)$ associated with $H(f)$, where $H(f)$ is the transfer function of the programmable leg alone.

The present invention advantageously includes a number of key features that are unavailable in prior art devices and systems. Foremost among these key improvements is the fact that the programmable SAW structure has now been removed from the primary signal path. The advantage gained by removal of the programmable SAW structure from the primary signal path is the elimination of any insertion loss issues associated with the SAW structure. A second advantage is that the amplifier 19 provides a useful signal gain to drive the splitter 22. Another important innovation is that the SAW portion of the circuit is employed as a programmable impedance element as compared to the programmable filter directly.

Figure 2:
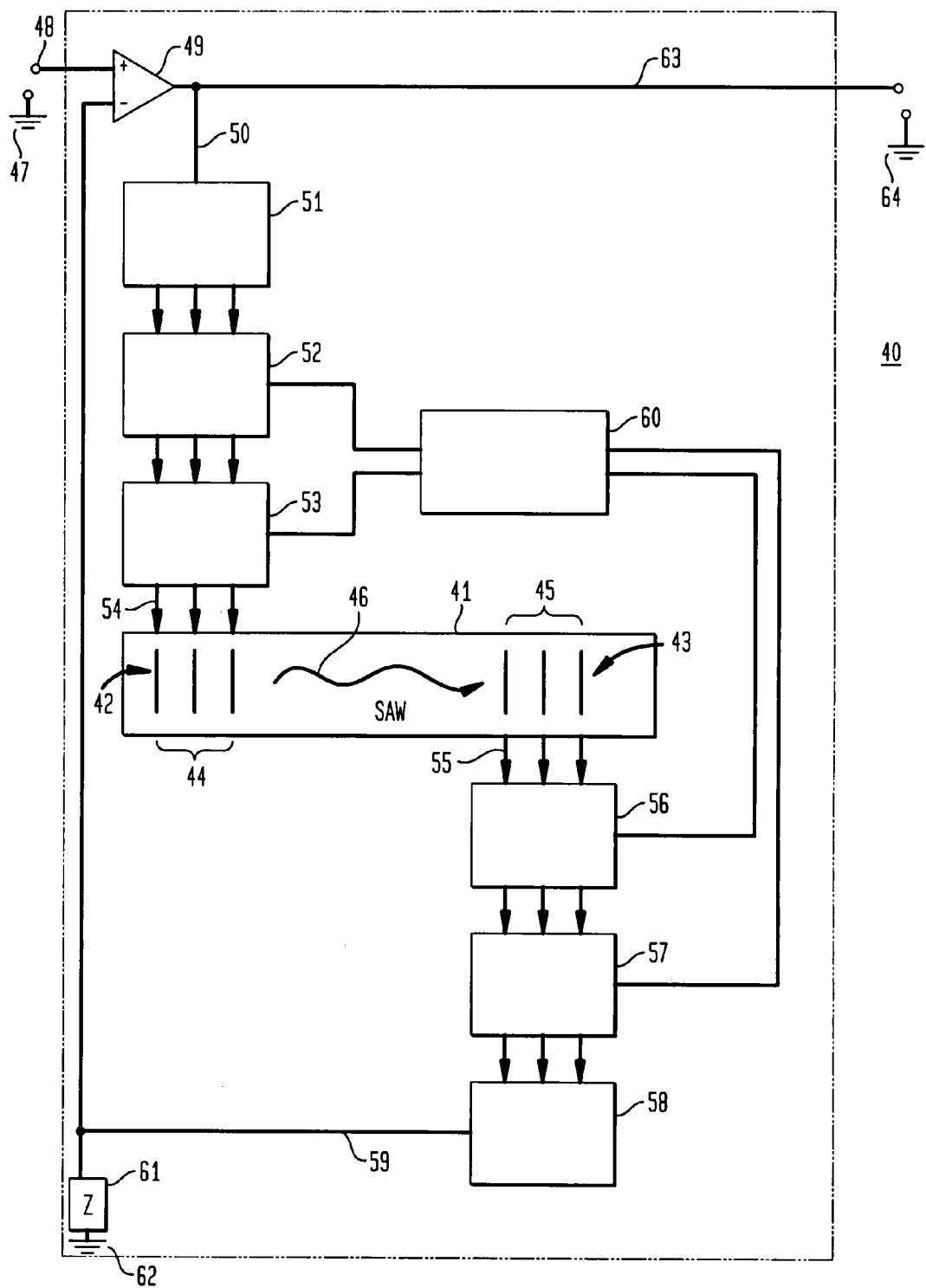
FIG. 2 is a diagram of the programmable SAW filter module with the amplifier preceding the input splitter and the impedance connected to the combiner in accordance with the present invention.

Referring now to FIG. 2, there is a diagram of the second embodiment of the programmable SAW filter module 40 where the amplifier precedes the input splitter and the impedance is connected to the combiner. Like the first embodiment, the programmable SAW filter module 40 also comprises an amplifier, a splitter, a piezoelectric substrate, a means for program control and a combiner, but in this embodiment the programmable SAW arm and the impedance are exchanged. An input signal is applied to input terminals 47 and 48 and thus to the non-inverting input of operational amplifier 49. The output 50 from operational amplifier 49 is provided in parallel to the module output terminals 63 and 64 and the input splitter 51 of the programmable SAW arm. The input splitter 51 splits the input signal 50 for an input phase shifter 52 that independently varies the phase of a number of the split input signals 54 and provides a phase-shifted input signal to an input gain control 53. The input gain control 53 provides a variable gain to each split input signal 54 applied to each of the input IDT electrode fingers 44 on the surface of a piezoelectric substrate 41.

Piezoelectric substrate 41 hosts input IDT electrode fingers 44, each having uniform spacing and width that provide an input unidirectional transducer 42 and output IDT electrode fingers 45 that provide an output unidirectional transducer 43. SAW 46 is generated by the input unidirectional transducer 42 and detected by the output unidirectional transducer 43. The input phase shifter 51 properly adjusts the phases of the split input signals 54 such that the input IDT electrode fingers 44 function as a unidirectional interdigitated transducer.

The output IDT electrode fingers 45 have a uniform spacing and width which differs from that of the input IDT electrode fingers 44 such that mechanical triple transit echo is avoided. The output of the output unidirectional transducer 43 is provided to a variable output gain control 56, which is variable with a different output gain or weighting coefficient being applied to each output IDT finger 45 in the output unidirectional transducer 13. An output phase shifter 57 is coupled to the output gain control 56 and provides a variable phase shift for some of the IDT output signals 55. Proper selection of the signal phase applied to the IDT output signals 55 results in the output interdigitated transducer electrode fingers 15 functioning as a unidirectional interdigitated transducer. The output phase shifter 57 provides a variable phase shift for a selected group of IDT output signals and provides a phase-shifted group of IDT output signals to combiner 58. The combiner 58 combines or sums the individual electrode finger output signals 55 to form a single composite output signal 59. The composite output of the programmable SAW leg is applied in parallel to an impedance 61 and to the inverting input of operational amplifier 49. Impedance 61 is also connected to ground 62. A phase control circuit and gain control circuit, both represented by Box 60, are coupled to the input phase shifter 52, the input gain control 53, the output gain control 56 and the output phase shifter 57 to selectively monitor, control or program the variable phase and the variable gain of the individual input and output signals.

In this embodiment of the programmable SAW filter module 40 the programmable SAW arm providing for a programmable SAW impedance element and the feedback impedance are exchanged as compared to the first embodiment's programmable SAW filter module 10. In so doing, the transfer function for this embodiment is now:

$$T(f) = 1 + \frac{Z_{SAW}(f)}{Z(f)} \quad (6)$$

Here, the programmable SAW portion is used to provide a programmable impedance, but with a behavioral inversion. That is, in this embodiment, the transfer function $T(f)$ is largest where $Z_{SAW}(f)$ is the largest and the smallest where $Z_{SAW}(f)$ is near zero, with transfer function $T(f)$ approaching a limiting value of $T(f)=1$. In this case, to generate a band pass filter for $T(f)$ requires a bandstop approach to $H(f)$, which is the transfer function of the programmable leg.

In the third embodiment of the present invention, programmable SAW devices are used as programmable impedances $Z_1(f)$ and $Z_2(f)$ in both circuit branches with the input to output transfer function of the overall module given by the following expression:

$$T(f) = 1 + \frac{Z_2(f)}{Z_1(f)} \quad (7)$$

In order to generate a bandpass $T(f)$, programmable impedance $Z_2(f)$ is configured as a bandstop impedance with:

$$Z_2(f) \gg Z_1(f) \tag{8}$$

in the passband and similarly programmable impedance $Z_1(f)$ is configured as a bandpass impedance with:

$$Z_1(f) \ll Z_2(f) \tag{9}$$

in the passband.

Figure 3:
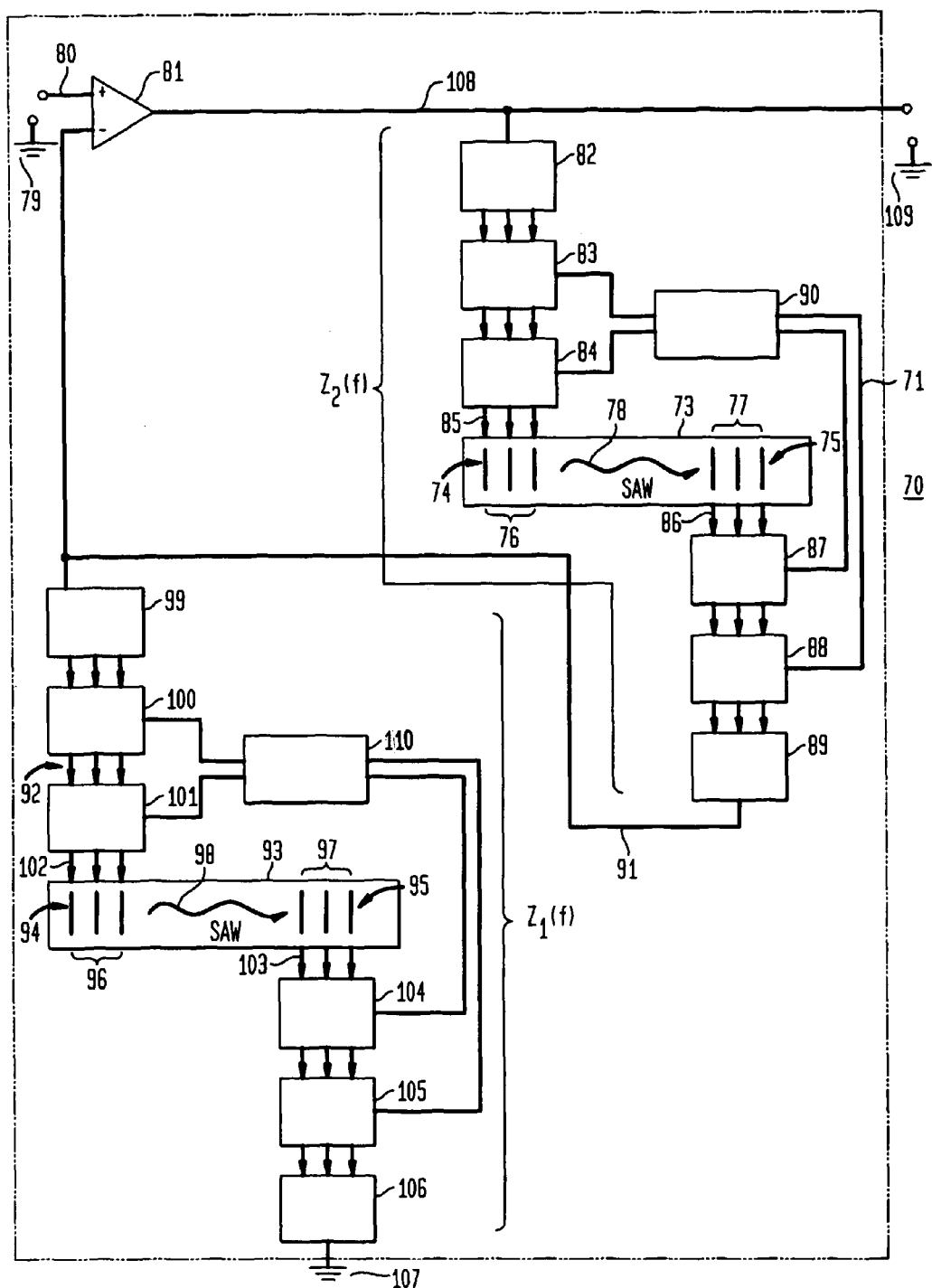
FIG. 3 is a diagram of the programmable SAW filter module with programmable SAW devices in both branches of the circuit in accordance with the present invention.

Referring now to FIG. 3, there is depicted a conceptual diagram of another embodiment of the programmable SAW filter module 70, comprising a pair of the FIG. 1 programmable SAW arms configured into a $Z_1(f)$ branch and a $Z_2(f)$ branch. An input signal is applied to input terminals 79 and 80 and thus to the non-inverting input of operational amplifier 81. The output of operational amplifier 81 is fed in parallel to the output terminals 108 and 109 and to the programmable SAW arm $Z_2(f)$. The majority of the signal is provided to the module output terminals 108 and 109 while a small portion is provided as a feedback signal to the programmable SAW arm $Z_2(f)$ which functions to provide a programmable impedance $Z_2(f)$. The programmable SAW arm $Z_2(f)$ is similar in form and function to those in the previously described embodiments. The small feedback signal is applied to the first component of the programmable SAW arm $Z_2(f)$ comprising an input splitter 82 to split the feedback signal for an input phase shifter 83 that independently varies the phase of a number of the split feedback signals 85 and provides a set of phase-shifted input signals to an input gain control 84. The input gain control 84 provides a variable gain to each split input signal applied to each of the input IDT electrode fingers 76 formed on the surface of a piezoelectric substrate 73. Piezoelectric substrate 73 hosts input IDT electrode fingers 76, each having uniform spacing and width and operated in such a fashion as to provide an input unidirectional transducer 74, and output IDT electrode fingers 77 also having uniform spacing and width and operated in such a fashion as to provide an output unidirectional transducer 75. The width and spacing of the input IDT electrode fingers 76 differs sufficiently from that of the output IDT electrode fingers 77 as to eliminate mechanical triple transit echo. SAW 78 is generated by the input unidirectional transducer 74 and detected by the output unidirectional transducer 75. The input phase shifter 83 properly selects the signal phases for the split feedback signals 85 such that the input IDT electrode fingers 76 function as a unidirectional interdigitated transducer 74.

The output signals 86 generated by output IDT electrode fingers 77 of the output unidirectional transducer 75 are provided to a variable output gain control 87, which is variable with a different output gain or weighting coefficient being applied to each output signal 86. An output phase shifter 88 is coupled to the output gain control 87 and provides a variable phase shift for some of the IDT output signals 86. Proper selection of the signal phase applied to these signals results in the output IDT electrode fingers 77 functioning as a unidirectional interdigitated transducer 75. The output phase shifter 88 provides the set of output signals 86 to a combiner 89 which forms a composite output feedback signal 91 as the sum of the individual output signals 86. A phase control circuit and gain control circuit, both represented by Box 90, are coupled to the input phase shifter 83, the input gain control 84, the output gain control 87 and the output phase shifter 88 to selectively monitor, control or program the variable phase and the variable gain of the individual input and output signals.

The composite output feedback signal 91 is fed in parallel to the inverting input of operational amplifier 81 and to the input of the second programmable SAW arm that functions to provide a programmable impedance $Z_1(f)$. The topology and functioning of the $Z_1(f)$ branch is similar to that of the $Z_2(f)$ branch with $Z_1(f)$ comprising input and output splitters 99 and 106 respectively, input and output phase shifters 100 and 105 respectively, input and output gain control 101 and 104 respectively, input and output IDT electrode fingers 96 and 97 respectively operated as input and output unidirectional IDTs 94 and 95 respectively, SAW 98 propagating on substrate 93, and phase control circuit and gain control circuit, both represented by Box 110. The output of the programmable SAW branch providing for programmable impedance $Z_1(f)$ is connected to ground 107.

The several possible embodiments of the present invention all place the operational amplifier 19, 49, 81 in a non-inverting configuration ahead of the programmable SAW impedance elements as a means of removing any broadband gain elements from the signal path. The circuit configuration shapes the gain profile or transfer function of the operational amplifier 19, 49, 81 in such a fashion as to reflect the impedance profiles of the programmable SAW devices according to mathematical expressions (1), (6) or (7) as appropriate. The circuit topology of this improved programmable SAW filter module yields immunity to signal capture, elimination of excess SAW contributions to the noise figure, and overall pre-amplifier gain sufficient to establish the overall system noise figure. Related topologies placing the operational amplifier in an inverting configuration fail to resolve these issues and thus are not used in this invention.

A number of variations are within the contemplation of the present invention. The programmable transversal filter used to provide a programmable impedance element in the present invention provides unidirectional transducers, which may be implemented as a multi-phase unidirectional transducer. A less efficient implementation is possible wherein the IDT electrode fingers are operated as bidirectional IDTs with an additional loss through the programmable SAW arms of 3 dB per transducer. The programmable transversal filter used in the present invention may incorporate power splitters or power combiners, phase shifters or time delays, gain blocks and an acoustic finger array. The components may be arranged in multiple configurations with respect to the order of gain and phase adjustments. Input and output electronics may be suitably connected to the acoustic portion. Preferably, the input and output electronics are fully integrated circuits comprising the power splitter and power combiner functions, the phase shift, and gain functions. The phase shift and gain functions are variable. A variety of different control circuits may be utilized for providing program control or varying the phase shift and gain functions. There may be a variety of alternative embodiments to implement the present invention. For example, different circuit embodiments may include use of real time delays. A combination of individual phase delays may be used with a switched array gain selection. Additionally, a combination of individual gain selections may be used with a switched array of phase shifters. The present invention may be composed of discrete components, a semiconductor and piezoelectric hybrid, or a fully integrated piezoelectric semiconductor integrated circuit.

It is to be further understood that other features and modifications to the foregoing detailed description of the programmable SAW filter module, device and apparatus are considered to be within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope

What I claim is:

1. A programmable surface acoustic wave filter module, comprising:
   a pair of input terminals;
   an input signal applied to one of said input terminals is received by a non-inverting input of an amplifier;
   an amplifier output is provided to a pair of output terminals and an impedance;
   a portion of said amplifier output passed through said impedance generates a feedback input signal that is applied in parallel to an inverting input of said amplifier and to a programmable SAW impedance element;
   a transfer function T(f) between said pair of input terminals and said pair of output terminals;
   an effective impedance $Z_{SAW}(f)$;
   said programmable SAW impedance element further comprising an input splitter, an input phase shifter, an input gain control, a group of input IDT electrode fingers and a group of output IDT electrode fingers;
   said group of input IDT electrode fingers, functioning as an input interdigitated transducer, and said group of output IDT electrode fingers, functioning as an output interdigitated transducer, being positioned on a piezoelectric substrate, said group of input IDT electrode fingers each having a uniform spacing and width;
   said input splitter splits said feedback input signal into a plurality of split input signals for said input phase shifter, said input phase shifter independently varies a phase of said plurality of split input signals and provides a set of variable phase input signals to said input gain control, said input gain control provides a variable gain to each of said plurality of split input signals applied to each of said group of input IDT electrode fingers;
   said input interdigitated transducer generates a surface acoustic wave (SAW) detected by said output unidirectional transducer;
   said plurality of output IDT electrode fingers each having a differing uniform spacing and width from said group of input IDT electrode fingers to avoid a mechanical triple transit echo;
   a plurality of IDT output signals from said output interdigitated transducer are provided to a variable output gain control;
   an output phase shifter is coupled to said variable output gain control to provide a variable phase shift for a selected group of said plurality of IDT output signals and provide a phase-shifted group of IDT output signals to a combiner;
   said combiner sums said phase-shifted group of IDT output signals to form a composite output signal;
   a phase control circuit and a gain control circuit coupled to the input phase shifter, the input gain control, the output gain control and the output phase shifter to selectively control the variable phase and the variable gain of the individual input and output signals;
   said composite output signal is delivered to a ground;
   said transfer function T(f) being obtained indirectly based upon said effective impedance $Z_{SAW}(f)$; and
   said SAW being generated by said programmable impedance element causes said module to eliminate an insertion loss penalty, an unwanted propagation loss and a plurality of strong signal capture effects with said module being removed from a primary signal path.

2. The programmable surface acoustic wave filter module, as recited in claim 1, further comprising said variable output gain control being variable by applying a different output gain to each of said group of output IDT electrode fingers in the output interdigitated transducer.

3. The programmable surface acoustic wave filter module, as recited in claim 2, further comprising:
   said transfer function T(f) being given by the expression:

$$T(f) = 1 + \frac{Z(f)}{Z_{SAW}(f)}$$

where said Z(f) represents said impedance that generates said feedback input signal and said $Z_{SAW}(f)$ is said effective impedance.

4. The programmable surface acoustic wave filter module, as recited in claim 3, further comprising a plurality of integrated circuits.

5. The programmable surface acoustic wave filter module, as recited in claim 3, further comprising said amplifier preceding said input splitter.

6. A programmable surface acoustic wave filter device, comprising:
   a pair of input terminals;
   an input signal applied to one of said input terminals is received by a non-inverting input of an amplifier;
   an amplifier output is provided to a pair of output terminals and an input splitter of a programmable SAW impedance element;
   a transfer function T(f) between said pair of input terminals and said pair of output terminals;
   an effective impedance $Z_{SAW}(f)$;
   said programmable SAW impedance element further comprising said input splitter, an input phase shifter, an input gain control, a group of input IDT electrode fingers and a group of output IDT electrode fingers;
   said group of input IDT electrode fingers, functioning as an input interdigitated transducer, and said group of output IDT electrode fingers, functioning as an output interdigitated transducer, being positioned on a piezoelectric substrate, said group of input IDT electrode fingers each having a uniform spacing and width;
   said input splitter splits said input signal into a plurality of split input signals for said input phase shifter, said input phase shifter independently varies a phase of said plurality of split input signals and provides a set of variable phase input signals to said input gain control, said input gain control provides a variable gain to each of said plurality of split input signals applied to each of said group of input IDT electrode fingers;
   said input interdigitated transducer generates a surface acoustic wave (SAW) detected by said output interdigitated transducer;
   said group of output IDT electrode fingers each having a differing uniform spacing and width from said group of input IDT electrode fingers to avoid a mechanical triple transit echo;
   a plurality of IDT output signals from said output interdigitated transducer are provided to a variable output gain control;
   an output phase shifter is coupled to said output gain control to provide a variable phase shift for a selected group of said plurality of IDT output signals and provide a phase-shifted group of IDT output signals to a combiner;

said combiner sums said phase-shifted group of IDT output
signals to form a composite output signal;
said composite output signal being applied in parallel to an
impedance and to said inverting input of the amplifier;
said impedance being connected to a ground;
a phase control circuit and a gain control circuit coupled to
the input phase shifter, the input gain control, the output
gain control and the output phase shifter to selectively
control the variable phase and the variable gain of the
individual input and output signals;
said transfer function T($f$) being obtained indirectly based
upon said effective impedance $Z_{SAW}(f)$; and
said SAW being generated by said programmable impedance element causes said device to eliminate an insertion
loss penalty, an unwanted propagation loss and a plurality of strong signal capture effects with said module
being removed from a primary signal path.

7. The programmable surface acoustic wave filter module,
as recited in claim 6, further comprising said impedance
being connected to said combiner.

8. The programmable surface acoustic wave filter device,
as recited in claim 6, further comprising said variable output
gain control being variable by applying a different output gain
to each of said group of output IDT electrode fingers in the
output interdigitated transducer.

9. The programmable surface acoustic wave filter device,
as recited in claim 8, further comprising:
said transfer function T($f$) being given by the expression:

$$T(f) = 1 + \frac{Z_{SAW}(f)}{Z(f)}$$

where said Z($f$) represents said impedance; and
said programmable impedance element provides a programmable impedance with a behavioral inversion.

10. The programmable surface acoustic wave filter device,
as recited in claim 9, further comprising a plurality of integrated circuits.

* * * * *